(12) United States Patent
Lin et al.

(10) Patent No.: US 9,926,488 B2
(45) Date of Patent: Mar. 27, 2018

(54) PHOSPHOR

(71) Applicant: EPISTAR CORPORATION, Hsinchu (TW)

(72) Inventors: Chun Che Lin, Hsinchu (TW); Ling-Ling Wei, Hsinchu (TW); Ru-Shi Liu, Hsinchu (TW); Ming-Chi Hsu, Hsinchu (TW); Ai-Sen Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 167 days.

(21) Appl. No.: 14/826,661

(22) Filed: Aug. 14, 2015

(65) Prior Publication Data
US 2017/0044431 A1 Feb. 16, 2017

(51) Int. Cl.
C09K 11/66 (2006.01)
C09K 11/61 (2006.01)
H05B 33/12 (2006.01)

(52) U.S. Cl.
CPC .......... *C09K 11/666* (2013.01); *C09K 11/617* (2013.01); *C09K 11/665* (2013.01); *H05B 33/12* (2013.01)

(58) Field of Classification Search
CPC ... C09K 11/666; C09K 11/617; C09K 11/665; H05B 33/12
See application file for complete search history.

(56) References Cited

U.S. PATENT DOCUMENTS 7,497,973 B2 * 3/2009 Radkov ............... C09K 11/617
252/301.4 F
8,491,816 B2 * 7/2013 Hong .................. C09K 11/616
252/301.4 H

FOREIGN PATENT DOCUMENTS

JP 2013-014715 * 1/2013

OTHER PUBLICATIONS

Translation for JP 2013-14715, Jan. 24, 2013.*

* cited by examiner

*Primary Examiner* — C Melissa Koslow
(74) *Attorney, Agent, or Firm* — Muncy, Geissler, Olds & Lowe, P.C.

(57) ABSTRACT

A phosphor, having a general formula of $K_2[Si_{1-x}Ge_x]_yF_6$:$Mn_{1-y}^{4+}$. The phosphor is excited to emit a light having a first main emission peak with a first maximum emission intensity and a first dominant wavelength, wherein a relative emission intensity S of the light of the phosphor is constantly greater than 85% across an temperature of the phosphor between 300 K and 470 K during operation, wherein $S=(I_T/I_{RT})*100\%$, $I_{RT}$ and $I_T$ are the first maximum emission intensity when the temperature of the phosphor is at 300 K and T during operation respectively, and 300 K<T≤470K.

13 Claims, 14 Drawing Sheets

PHOSPHOR

TECHNICAL FIELD

The disclosure relates to a phosphor, and more particularly to a phosphor with better thermal stability.

DESCRIPTION OF BACKGROUND ART

There are many ways to produce white light emitting diodes (WLEDs), such as applying yellow phosphors to a blue light-emitting diode chip, applying red and green phosphors to a blue light-emitting diode chip, mixing red, green, and blue light-emitting diode chips or applying blue, green, and red phosphors to a UV light-emitting diode.

Compared to a traditional incandescent light bulb, a white light-emitting diode has some advantages, e.g. long lifetime, low power consumption, small volume, fast response time and good shock-resistance, and thus light-emitting diodes are gradually replacing traditional lighting products. As a result, in the lighting market, auxiliary lighting, including flash lights, car interior lights, architectural decorative lighting products, is still the main market of white light-emitting diodes, while still white light-emitting diodes are expected to replace traditional lighting products in the future to become the mainstream of the global lighting market. However, current white light emitting diodes still need to overcome the problems such as heat dissipation, inadequate brightness and relatively high price.

In addition to package techniques, phosphor material is also an important factor affecting luminous efficiency of a light source. Thus, solid state lighting companies are devoted to modifying phosphor compositions to increase phosphor conversion efficiency. The color rendering index of the white light generated by a yellow phosphor excited by a traditional single blue chip is low and thus the color saturation of an object illuminated by such white light is poor, thereby lowering the commercial lighting market value. Recently, it is found that using a high efficient UV-light-emitting diode (UV-LED) as an excitation light source is another way of white light emitting diodes to become lighting devices. Because the UV-LED technique is gradually developed, the phosphor development for matching to the emission wavelength of UV-LEDs and thus manufacture white light emitting diodes with high efficiency and high brightness becomes important.

SUMMARY OF THE DISCLOSURE

The present disclosure provides a phosphor, having a general formula of $K_2[Si_{1-x}Ge_x]_yF_6:Mn_{1-y}^{4+}$, wherein $0.4 \leq x \leq 0.8$ and $0.8 \leq y < 1$. The phosphor is excited to emit a light having a first main emission peak with a first maximum emission intensity and a first dominant wavelength, wherein a relative emission intensity S of the light of the phosphor is constantly greater than 85% across an temperature of the phosphor between 300 K and 470 K during operation, wherein $S=(I_T/I_{RT})*100\%$, $I_{RT}$ and $I_T$ are the first maximum emission intensity when the temperature of the phosphor is at 300 K and T during operation respectively, and 300 K<T≤470K.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
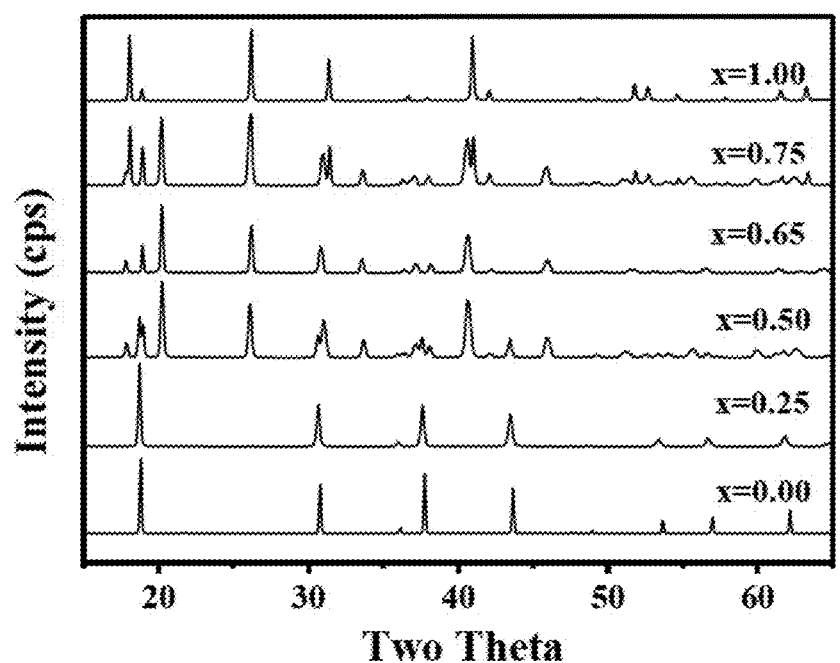
FIG. 1 shows an XRD spectrum of the phosphors of the first embodiment through the sixth embodiment.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scaled and components may be exaggerated in view of width, height, length, etc. Herein, the similar or identical reference numerals will denote the similar or identical components throughout the drawings.

One embodiment of the present disclosure provides a phosphor having a general formula of $K_2[Si_{1-x}Ge_x]_yF_6:Mn_{1-y}^{4+}$, wherein $0 \leq x \leq 1$, $0 < y < 1$, and $Mn^{4+}$ ions act as an activator for activating $K_2[Si_{1-x}Ge_x]_yF_6$ of the phosphor. In another embodiment, the general formula is $0.4 \leq x \leq 0.8$ and $0.8 \leq y < 1$. The phosphor can be excited by a light having a peak wavelength between 430 nm and 470 nm. As a result, the phosphor of the present application is suitable for applying to blue chips with a dominant wavelength between 430 nm and 470 nm so as to be excited by the radiation of the blue chips. After excited, the phosphor comprises multiple main emission peaks, wherein the first main emission peak has the first maximum emission intensity; the second main emission peak has the second maximum emission intensity, and so on. Specifically, the first maximum emission intensity is greater than the second maximum emission intensity. A relative emission intensity S of the light of the phosphor is constantly greater than 85% across an temperature of the phosphor between 300 K and 470 K during operation, wherein $S=(I_T/I_{RT})*100\%$, $I_{RT}$ and $I_T$ are the first maximum emission intensity when the temperature of the phosphor is at 300 K and T during operation respectively, and 300 K<T≤470K. The temperature of the phosphor is a temperature reaches steady-state. Preferably, the relative emission intensity is between 97% and 105% when 320 K≤T≤420 K. Preferably, the relative emission intensity is between 95% and 115% when 350 K≤T≤430 K. The excited light from the phosphor of the present application remains at least 85% of the original intensity at 300K when the temperature of the phosphor is between 300K and 470K during operation. As a result, the phosphor of the present application has an excellent thermal stability. Accordingly, the phosphor is suitable for applications in compact electronic devices, such as mobile phones, or back light modules.

The ratio of the first maximum emission intensity of the first main emission peak to the second maximum emission intensity of the second main emission peak is between about 1.1 and 1.7, and preferably, between 1.2 and 1.5. The first main emission peak has a first dominant wavelength between 600 nm and 650 nm, and preferably, between 625 nm and 635 nm. The first main emission peak of the excited light from the phosphor has a first full width at half maximum (FWHM) less than 6 nm, and preferably, less than 5 nm, and more preferably, less than 3.5 nm, to achieve high color purity and high luminous efficiency. The second main emission peak of the excited light from the phosphor has a second full width at half maximum (FWHM) less than 7 nm, and preferably, less than 5 nm, and more preferably, less than 3.5 nm to achieve high color purity and high luminous efficiency.

The phosphor comprises multiple discrete particles. The multiple discrete particles have an average particle diameter not less than 10 um, and preferably, between 10 μm and 60 μm. Specifically, a particle diameter of each particle is regarded as the largest distance within the particle from a top-view SEM image. Preferably, the average particle diameter ($D_a$) is determined by an equation: $D_s/N_t$, wherein $D_s$ is the sum of the particle diameters of each particle within an area of 130 um*130 um, and $N_{t\ is}$ the number of the particles within an area of 130 um*130 um. Preferably, each of the particles has a particle diameter less than 150 um in the area.

The particles are counted from a top-view SEM image. Specifically, particles with a particle diameter less than 0.5 um are ignored. The particles at the back, mostly blocked by the particles at the front side and thus the particle diameters cannot be determined can be ignored.

Preferably, at least 50% of total discrete particles within an area of 130 um*130 um from a top-view SEM image are in the shape of irregular polyhedron. One of the particles has a number of faces, wherein the number is not less than 3, and preferably, the number is not less than 4.

The method of making the phosphor comprises two stages. The first stage comprises preparing a manganese compound having a formula of $K_2[MnF_6]$. Specifically, the first stage comprises the steps of: (a) preparing a first solution by dissolving a potassium compound and a permanganate compound by a first fluorine-based solvent, wherein the potassium compound comprises KF, $KHF_2$, $KNO_3$, $K_2SO_4$, $KHSO_4$, $K_2CO_3$, $KHCO_3$ or KOH. The permanganate compound is soluble in the first fluorine-based solvent and generating a permanganate anion when dissolved by the first fluorine-based solvent. The permanganate compound comprises, but is not limited to, $NH_4MnO_4$, $Ca(MnO_4)_2$, $KMnO_4$, $NaMnO_4$, $AgMnO_4$. Preferably, the permanganate compound has a formula of $AMnO_4$, wherein A is selected from the group consisting of K, Na, Li, Rb, Cs and $NH_4$. The first fluorine-based solvent comprises hydrofluoric acid (HF).

The ratio of the amount of $AMnO_4$ and the amount of the potassium compound is within a range of from 1:10 to 1:30 by weight ratio; (b) cooling down the first solution to a temperature between 0° C. and 10° C.; (c) adding a reducing agent in an amount of between 5 and 10 mL dropwisely into the first solution to form a precipitant, which mostly comprises the manganese compound having the formula of $K_2[MnF_6]$, wherein the reducing agent comprises $H_2O_2$ or $H_2$. Optionally, after the step (c), the first stage further comprises a step of: (d) washing the precipitant by a solvent, e.g. acetone, and drying the precipitant under a temperature between 30° C. and 50° C. so as to purify the precipitant.

The second stage comprises the steps of: (a) preparing a second solution comprising at least one of silicon oxide and germanium oxide and comprising a second potassium compound by mixing at least one of a saturated solution of silicon oxide in a second fluorine-based solvent and a saturated solution of germanium oxide in a third fluorine-based solvent with a second potassium compound in a fourth fluorine-based solvent. Preferably, the second fluorine-based solvent, third fluorine-based solvent and the fourth fluorine-based solvent comprise HF acid. The second potassium compound comprises KF, $KHF_2$, $KNO_3$, $K_2SO_4$, $KHSO_4$, $K_2CO_3$, $KHCO_3$ or KOH. the ratio of the amount of the saturated solution of germanium oxide in a third fluorine-based solvent to the amount of the saturated solution of silicon oxide in a second fluorine-based solvent is x:(1−x) by mole ratio, wherein x and 1−x are denoted in the phosphor formula $K_2[Si_{1-x}Ge_x]_yF_6:Mn_{1-y}^{4+}$, and $0 \le x \le 1$; (b) raising the temperature of the second solution to a range from 20° C. to 55° C.; (c) adding the precipitant prepared in the first stage in an amount of (1−y) mole into the second solution to obtain a third solution, wherein $0<y<1$; (d) after completely dissolving the precipitant, dropwisely adding a fourth solution of a third potassium compound in a fifth fluorine-based solvent into the third solution at a rate of between 2 mL/min and 5 mL/min and thus produce a second precipitant, which is the phosphor of the present application having a general formula of $K_2[Si_{1-x}Ge_x]_yF_6:Mn_{1-y}^{4+}$, wherein the fourth fluorine-based solvent comprises hydrofluoric acid (HF), the third potassium compound comprises KF, $KHF_2$, $KNO_3$, $K_2SO_4$, $KHSO_4$, $K_2CO_3$, $KHCO_3$ or KOH. Optionally, after the step (d), the second stage further comprises a step of: (e) washing the precipitant by a solvent e.g. HF or alcohol, and drying the second precipitant under a temperature between 30° C. and 50° C. so as to purify the phosphor.

It is noted that all steps of the method are carried out at temperatures under 70° C., and preferably under 60° C. As a result, the method of the present application is efficient, low-cost, safe and suitable for mass production. Besides, because the method comprises two stages for forming the precursor $K_2[MnF_6]$ firstly and then forming the phosphor afterwards, the phosphor made by the two-stage method has better thermal stability and has discrete particle morphology. Specifically, the phosphor benefits from the step (b) and the step (d) of the second stage to achieve an average particle diameter not less than 10 um, and at least 50% of total discrete particles discrete particles are in the shape of irregular polyhedron.

First Embodiment

The phosphor in accordance with the present embodiment of the present application has a formula of $K_2[SiF_6]_{0.95}:Mn_{0.05}^{4+}$.

Second Embodiment

The phosphor in accordance with the present embodiment of the present application has a formula of $K_2[Si_{0.75}Ge_{0.25}]_{0.95}F_6:Mn_{0.05}^{4+}$.

Third Embodiment

The phosphor in accordance with the present embodiment of the present application has a formula of $K_2[Si_{0.5}Ge_{0.5}]_{0.95}F_6:Mn_{0.05}^{4+}$.

Fourth Embodiment

The phosphor in accordance with the present embodiment of the present application has a formula of $K_2[Si_{0.35}Ge_{0.65}]_{0.95}F_6:Mn_{0.05}^{4+}$.

Fifth Embodiment

The phosphor in accordance with the present embodiment of the present application has a formula of $K_2[Si_{0.25}Ge_{0.75}]_{0.95}F_6:Mn_{0.05}^{4+}$.

Sixth Embodiment

The phosphor in accordance with the present embodiment of the present application has a formula of $K_2[GeF_6]_{0.95}:Mn_{0.05}^{4+}$.

The methods of making the phosphors of the first to the sixth embodiments are substantially the same as mentioned above. The methods of making the phosphors of the first to the sixth embodiments will now be described in further detail.

The first stage comprises the steps of: (a) preparing a first solution by dissolving $KHF_2$ and $KMnO_4$ in HF acid, wherein the amount of $KMnO_4$ and the amount of $KHF_2$ is within a range of from 1:18 to 1:22 by weight ratio; (b) cooling down the first solution to a temperature about 5° C.; (c) adding $H_2O_2$ dropwisely into the first solution to turn the first solution from purple to yellow-brown during the addition, and thus forming a yellow precipitant, which mostly comprises $K_2[MnF_6]$ (d) washing the precipitant by acetone, and drying the precipitant under a temperature of about 50° C. so as to purify the precipitant.

The second stage comprises the steps of: (a) preparing a second solution comprising at least one of silicon oxide and germanium oxide and comprising KF by mixing at least one of a saturated solution of silicon oxide in HF acid and a saturated solution of germanium oxide in HF acid to KF in HF acid, the amount of the saturated solution of silicon oxide in HF acid to the amount of the saturated solution of germanium oxide in HF acid is 1:0, 0.75:0.25, 0.5:0.5, 0.35:0.65, 0.25:0.75, and 0:1 by mole ratio of the first to sixth embodiments respectively; (b) raising the temperature of the second solution to about 52° C.; (c) adding the precipitant prepared in the first stage in an amount of 0.05 mole into the second solution to obtain a third solution; (d) after completely dissolving the precipitant, dropwisely adding a fourth solution of KF in HF acid in an amount of between 10 mL and 20 mL into the third solution at a rate of between about 2 and 5 mL/min and thus precipitating a second yellow precipitant, which is substantially the phosphor of the present application having a general formula of $K_2[Si_{1-x}Ge_x]_yF_6:Mn_{1-y}^{4+}$, wherein, preferably, the mixed solution of the fourth solution and the third solution is stirred at a rate between 200 and 300 rpm; (e) washing the precipitant by HF acid or alcohol, and drying the second precipitant under a temperature of about 50° C. for about one hour so as to form a purer phosphor.

FIG. 1 shows an XRD spectrum of the phosphors of the first embodiment through the sixth embodiment. The comparison samples are $K_2[SiF_6]$ of the cubic Fm3m space group (JCPDS, No. 85-13821,), $K_2GeF_6$ of the hexagonal P3m1 space group (JCPDS, No. 73-1531,) and $K_2GeF_6$ of the hexagonal P6$_3$m1 space group (JCPDS, No. 75-0951).

As shown in FIG. 1, the phosphor of the first embodiment (x=0) has a single crystal structure of cubic Fm3m space group. The phosphor of the second embodiment (x=0.25) has a single crystal structure of cubic Fm3m space group. The phosphor of the third embodiment (x=0.5) has a crystal structure of cubic Fm3m space group and a crystal structure of hexagonal P6$_3$m1 space group both. The phosphor of the fourth embodiment (x=0.65) has a crystal structure of hexagonal P6$_3$m1 space group. The phosphor of the fifth embodiment (x=0.75) has a major crystal structure of hexagonal P6$_3$m1 space group and a minor crystal structure of hexagonal P3m1 space group. The phosphor of the sixth embodiment (x=1) has a single crystal structure of hexagonal P3m1 space group.

Figure 2A:
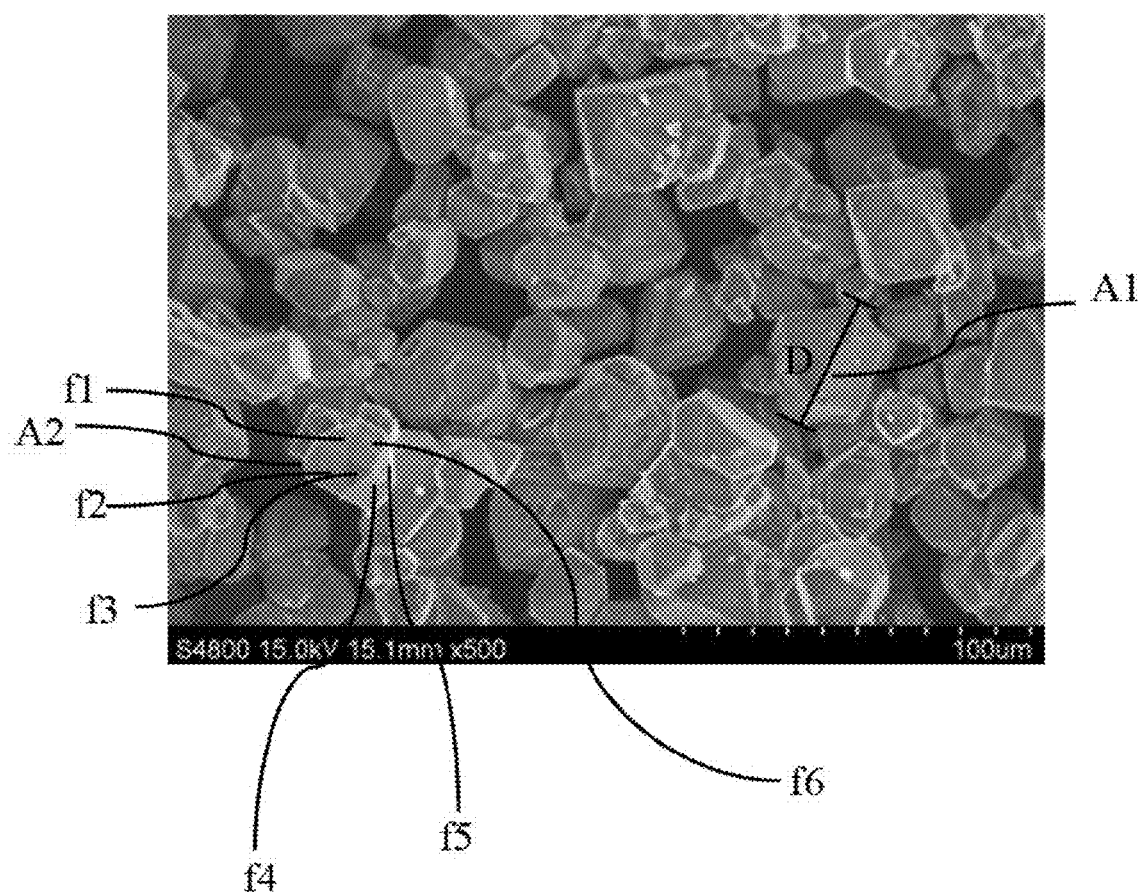
FIGS. 2a through 2f are SEM images of the phosphor depicted in the first through the sixth embodiment respectively.
Figure 2B:
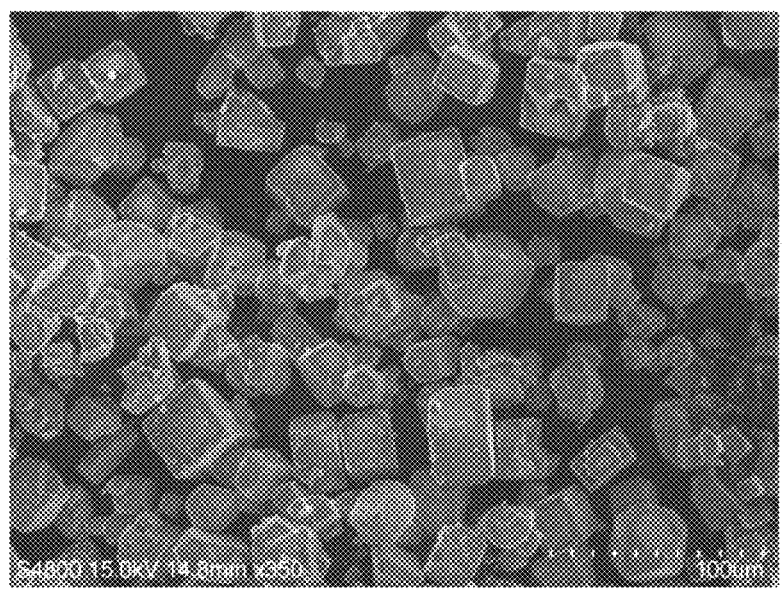
Figure 2C:
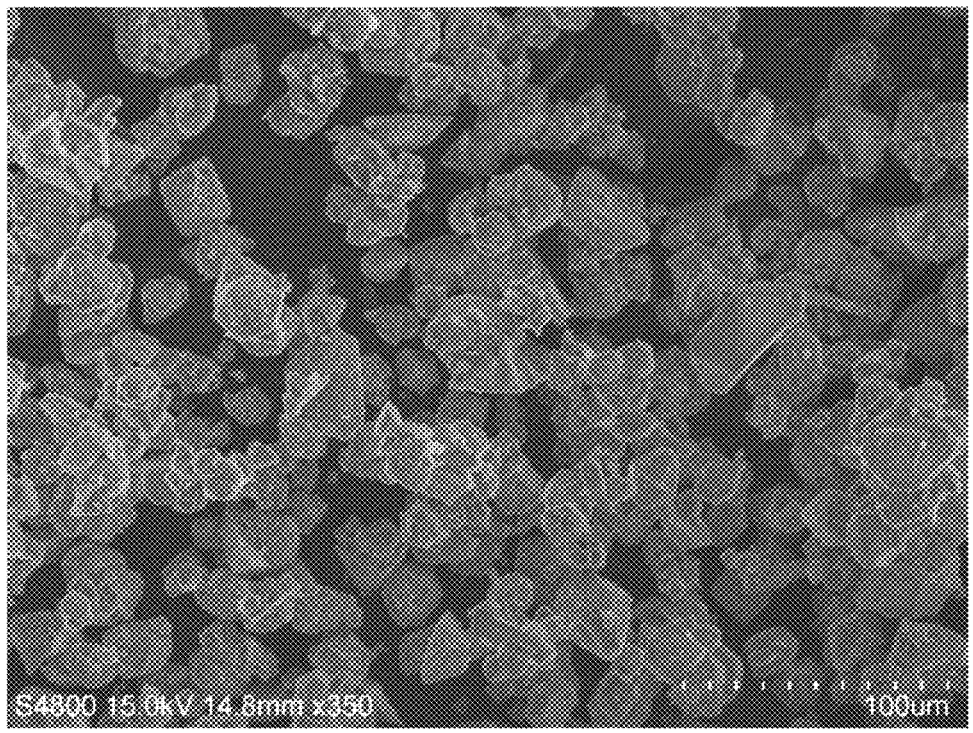
Figure 2D:
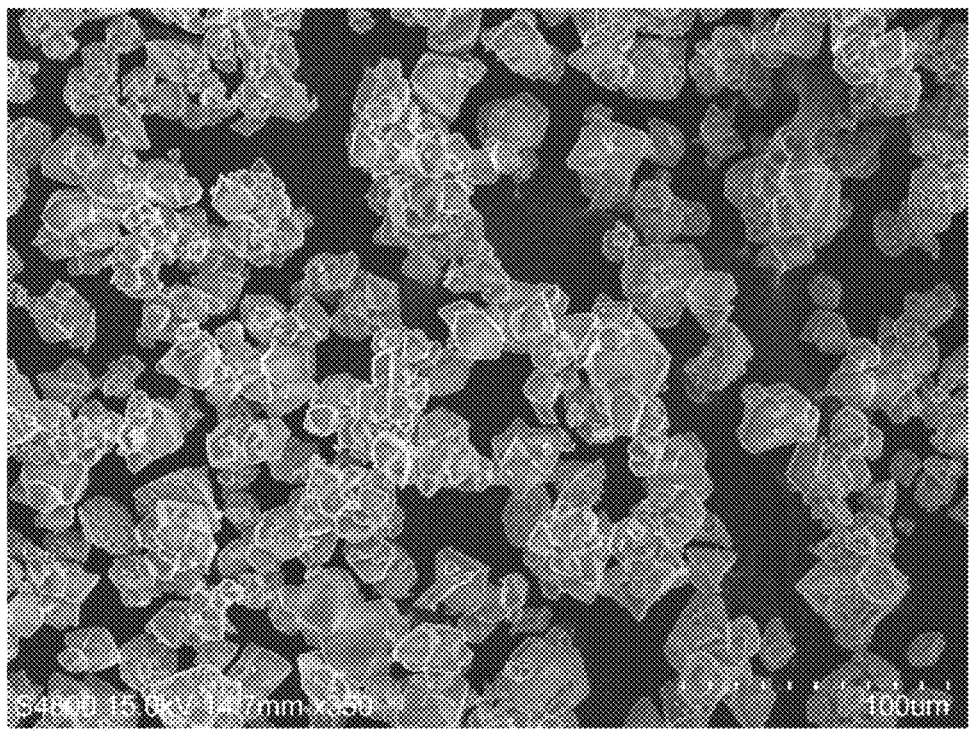
Figure 2E:
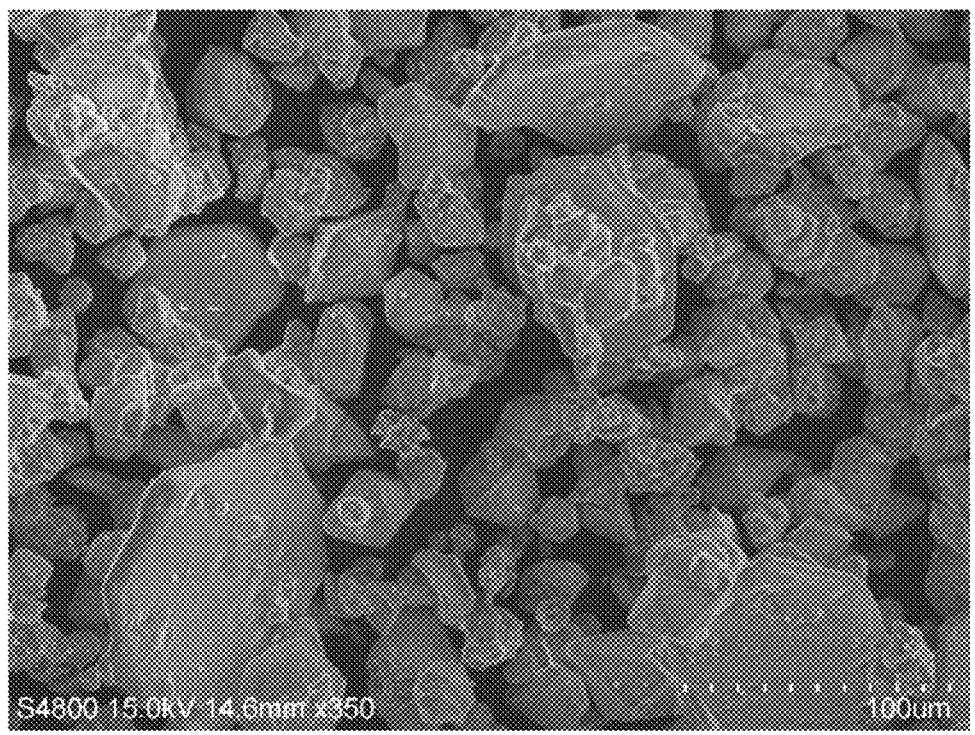
Figure 2F:
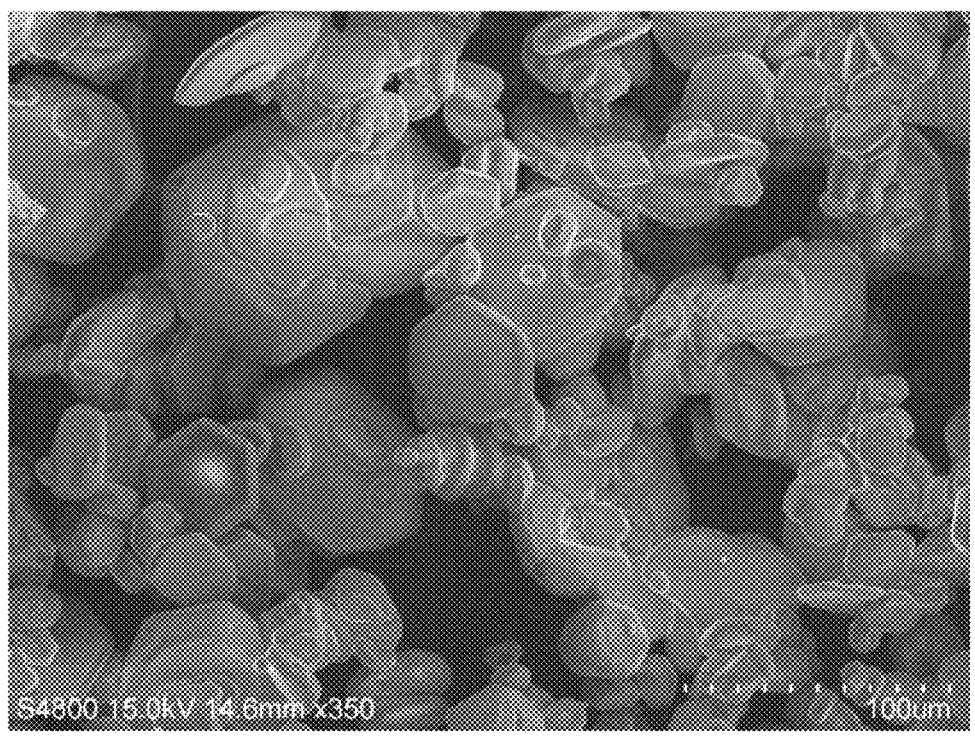
Figure 3:
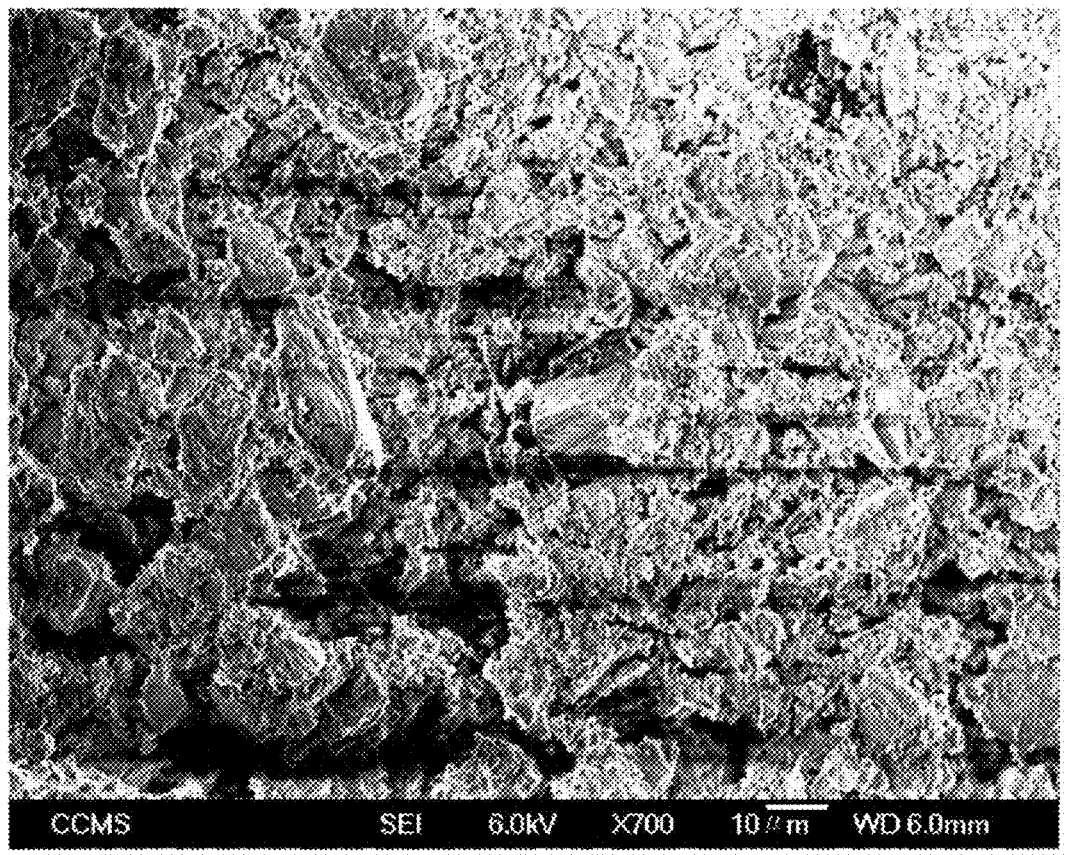
FIG. 3 is an SEM image of a phosphor made by wet-chemical etching of silicon wafers.
Figure 4A:
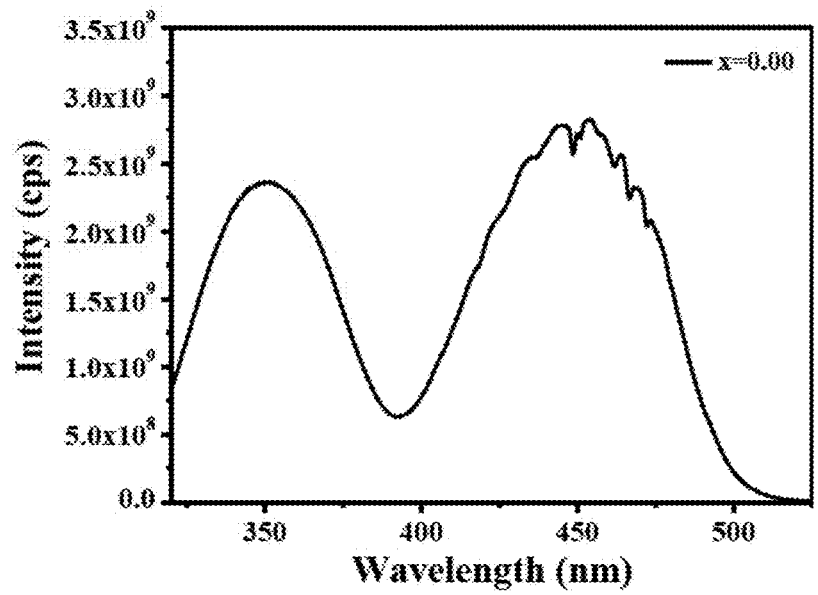
FIGS. 4a through 4f are the excitation spectrums of the phosphor depicted in the first through the sixth embodiment of the present application respectively.
Figure 4B:
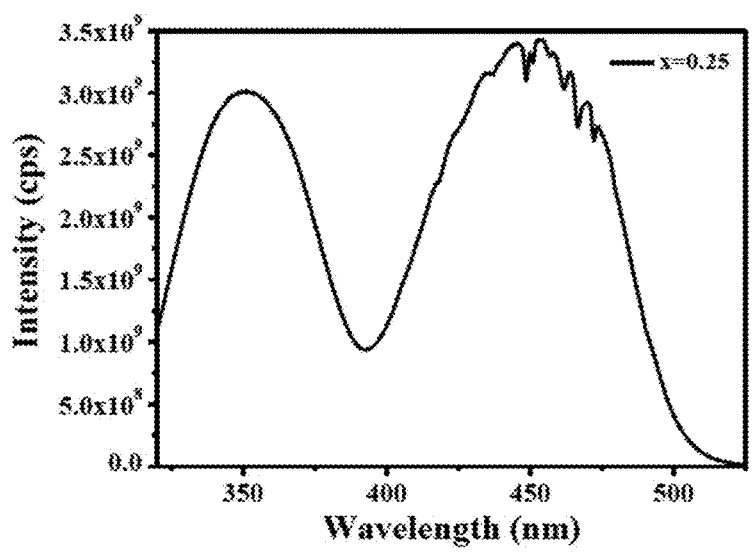
Figure 4C:
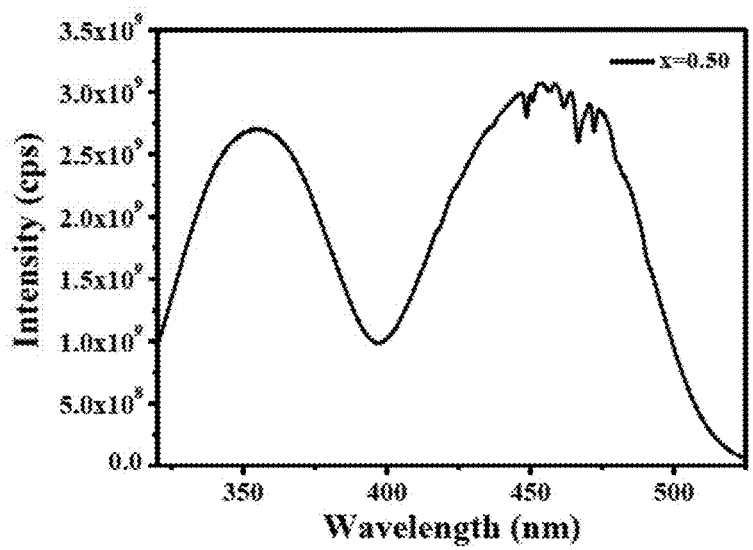
Figure 4D:
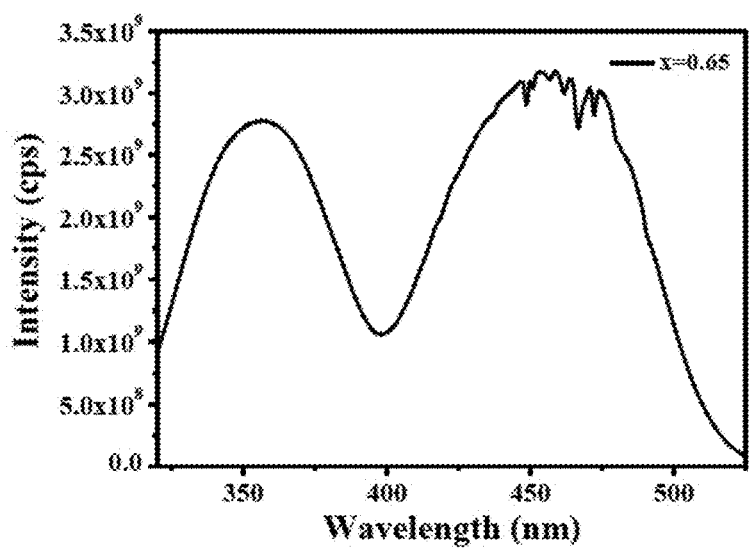
Figure 4E:
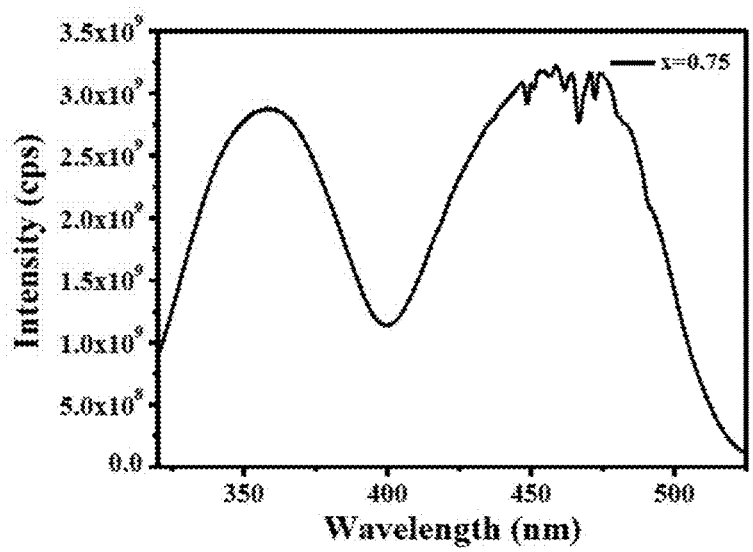
Figure 4F:
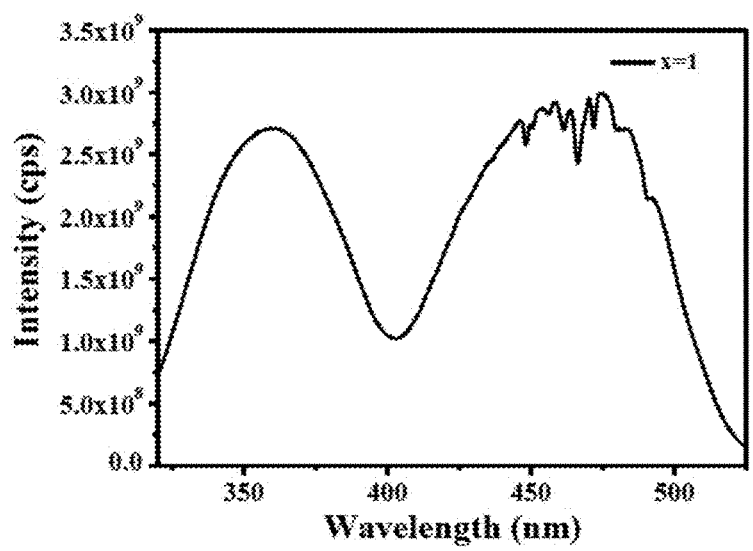

FIGS. 2a through 2f are SEM images of the phosphors of the first to sixth embodiments respectively. FIG. 3 is an SEM image of a phosphor made by wet-chemical etching of silicon wafers, which is different from the method of the present application. The phosphors of the present application as shown in FIGS. 2a through 2f have different morphology from that of the phosphor as shown in FIG. 3. As shown in FIGS. 2a through 2f, the phosphors of the first to sixth embodiments each comprises multiple discrete particles. As shown in FIG. 2a, the multiple discrete particles have an average particle between 30 μm and 50 μm. As shown in FIG. 2b, the multiple discrete particles have an average particle between 20 μm and 40 μm. As shown in FIG. 2c, the multiple discrete particles have an average particle between 15 μm and 40 μm. As shown in FIG. 2d, the multiple discrete particles have an average particle between 15 μm and 35 μm. As shown in FIG. 2e, the multiple discrete particles have an average particle between 20 μm and 50 μm. As shown in FIG. 2f, the multiple discrete particles have an average particle diameter between 15 μm and 45 μm. The average particle diameter is calculated by the equation $D_a=D_s/N_t$ as mentioned above. The particle diameter of each particle is regarded as the largest distance of the particle from the SEM image. For example, the particle diameter of the particle $A_1$ is denoted as D. Besides, at least 50% of total discrete particles within an area of 130 um*130 um from a top-view SEM image are in the shape of irregular polyhedron. For example, one of the particles $A_2$ as shown in FIG. 2a has a number of seeable faces $f_1$ to $f_6$. Accordingly, the number of seeable faces is not less than 3, and preferably, the number is not less than 4, and more preferably, the number is not less than 5. Specifically, the faces of the particles that can't be seen from the top-view SEM are not counted.

FIGS. 4a through 4f are the excitation spectrums of the phosphors of the first to the sixth embodiments respectively. As shown in FIGS. 4a through 4f, the phosphor of the present application can be excited by a light having a peak wavelength between 430 nm and 470 nm.

FIGS. 5a through 5f are the emission spectrums of the phosphors of the first to the sixth embodiments respectively. Tables 1 through 6 show the wavelengths and the intensities of the main emission peaks of the first to the sixth embodiments respectively. The first main emission peak has the first maximum emission intensity; the second main emission peak has the second maximum emission intensity, and so on. Specifically, the first maximum emission intensity is greater than the second maximum emission intensity.

TABLE 1 the wavelengths and the intensities of the main emission
peaks of the first embodiment
1st embodiment: $K_2[SiF_6]_{0.95}:Mn_{0.05}^{4+}$

| Main emission peak | Wavelength (nm) | Intensity (cps) |
| --- | --- | --- |
| fifth main emission peak ($P_5$) | 608.4 | 5.283E+08 |
| third main emission peak ($P_3$) | 612.8 | 1.122E+09 |
| first main emission peak ($P_1$) | 630.2 | 2.603E+09 |
| second main emission peak ($P_2$) | 634.4 | 1.991E+09 |
| fourth main emission peak ($P_4$) | 646.8 | 6.257E+08 |

Figure 5A:
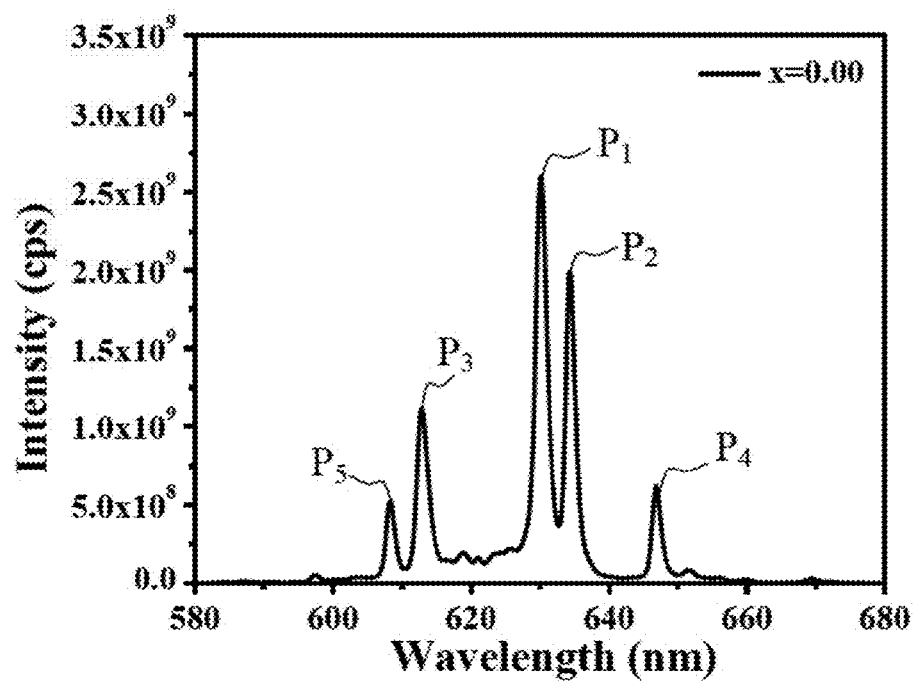
FIGS. 5a through 5f are the emission spectrums of the phosphor depicted in the first through the sixth embodiment of the present application respectively.

From Table 1 and FIG. 5a, the ratio of the first maximum emission intensity of the first main emission peak $P_1$ to the second maximum emission intensity of the second main emission peak $P_2$ is about 1.3.

FIG. 5a shows the full width at half maximum (FWHM) of the first main emission peak $P_1$ and the FWHM of the second main emission peak $P_2$ of the first embodiment. The FWHM of the first main emission peak $P_1$ of the first embodiment is about 2±0.1 nm. The FWHM of the second main emission peak $P_2$ of the first embodiment is about 1.6±0.1 nm.

TABLE 2 the wavelengths and the intensities of the main emission
peaks of the second embodiment
2nd embodiment: $K_2[Si_{0.75}Ge_{0.25}]_{0.95}F_6:Mn_{0.05}^{4+}$

| Main emission peak | Wavelength (nm) | Intensity (cps) |
| --- | --- | --- |
| fifth main emission peak ($P_5$) | 608.2 | 6.67E+08 |
| third main emission peak ($P_3$) | 612.8 | 1.39E+09 |
| first main emission peak ($P_1$) | 630 | 3.2E+09 |
| second main emission peak ($P_2$) | 634.2 | 2.5E+09 |
| fourth main emission peak ($P_4$) | 646.8 | 7.66E+08 |

From Table 2, the ratio of the first maximum emission intensity of the first main emission peak $P_1$ to the second maximum emission intensity of the second main emission peak $P_2$ is about 1.28.

Figure 5B:
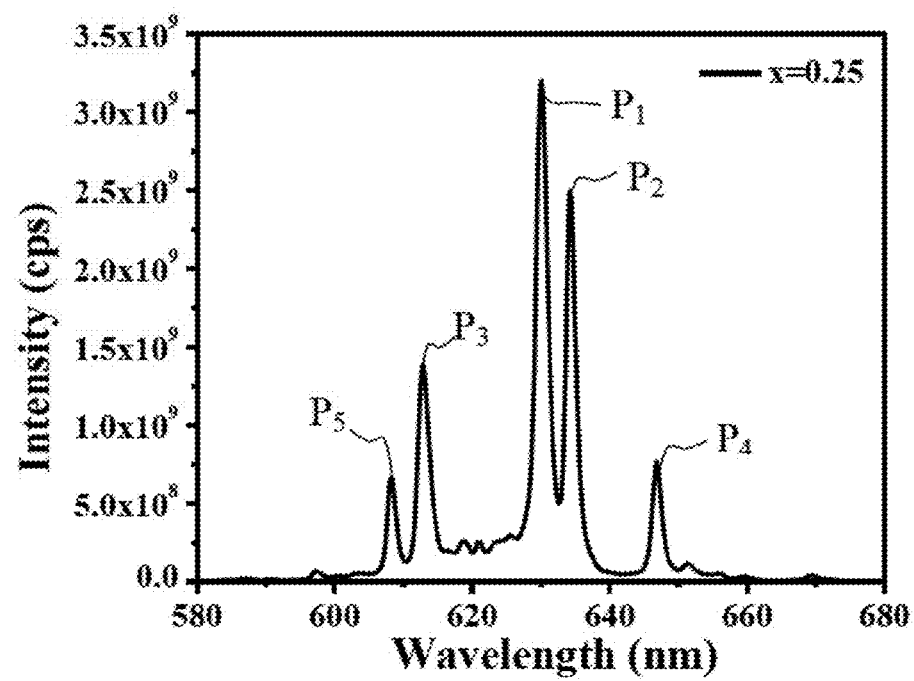

FIG. 5b shows the full width at half maximum (FWHM) of the first main emission peak $P_1$ and the full width at half maximum (FWHM) of the second main emission peak $P_2$ of the second embodiment. The FWHM of the first main emission peak $P_1$ of the second embodiment is about 2±0.1 nm. The FWHM of the second main emission peak $P_2$ of the second embodiment is about 1.8±0.1 nm.

Table 3. the wavelengths and the intensities of the main emission peaks of the third embodiment

TABLE 3

3rd embodiment: $K_2[Si_{0.5}Ge_{0.5}]_{0.95}F_6:Mn_{0.05}^{4+}$

| Main emission peak | Wavelength (nm) | Intensity (cps) |
| --- | --- | --- |
| sixth main emission peak ($P_6$) | 608.4 | 6.03E+08 |
| fourth main emission peak ($P_4$) | 613 | 1.27E+09 |
| third main emission peak ($P_3$) | 621.2 | 1.8E+09 |
| first main emission peak ($P_1$) | 630.2 | 3.05E+09 |
| second main emission peak ($P_2$) | 634.6 | 2.3E+09 |
| fifth main emission peak ($P_5$) | 646.8 | 6.76E+08 |
| | 647 | 6.76E+08 |

From Table 3, the ratio of the first maximum emission intensity of the first main emission peak $P_1$ to the second maximum emission intensity of the second main emission peak $P_2$ is about 1.33.

Figure 5C:
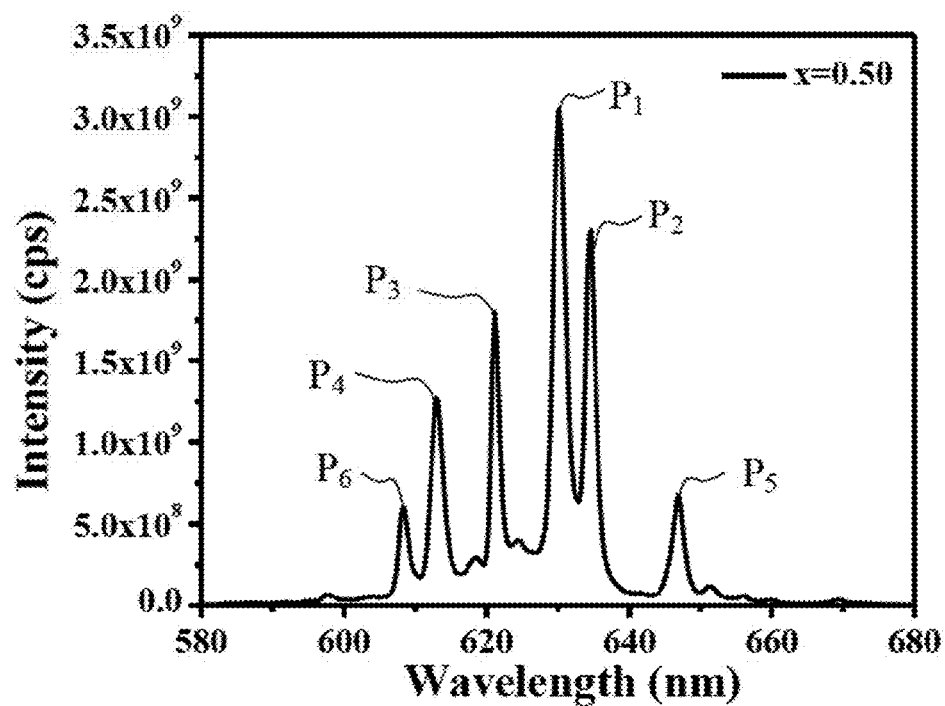

FIG. 5c shows the full width at half maximum (FWHM) of the first main emission peak $P_1$ and the full width at half maximum (FWHM) of the second main emission peak $P_2$ of the third embodiment. From FIG. 5c, the FWHM of the first main emission peak $P_1$ of the third embodiment is about 2±0.1 nm. The FWHM of the second main emission peak $p_1$ of the third embodiment is about 1.8±0.1 nm.

TABLE 4 the wavelengths and the intensities of the main emission
peaks of the fourth embodiment
4th embodiment: $K_2[Si_{0.35}Ge_{0.65}]_{0.95}F_6:Mn_{0.05}^{4+}$

| Main emission peak | Wavelength (nm) | Intensity (cps) |
| --- | --- | --- |
| sixth main emission peak ($P_6$) | 608.4 | 6.07E+08 |
| fourth main emission peak ($P_4$) | 612.9 | 1.26E+09 |
| | 613 | 1.26E+09 |
| third main emission peak ($P_3$) | 621.2 | 1.88E+09 |
| first main emission peak ($P_1$) | 630.1 | 2.86E+09 |
| second main emission peak ($P_2$) | 634.4 | 2.23E+09 |
| fifth main emission peak ($P_5$) | 646.9 | 7E+08 |

From Table 4, the ratio of the first maximum emission intensity of the first main emission peak $P_1$ to the second maximum emission intensity of the second main emission peak $P_2$ is about 1.28.

Figure 5D:
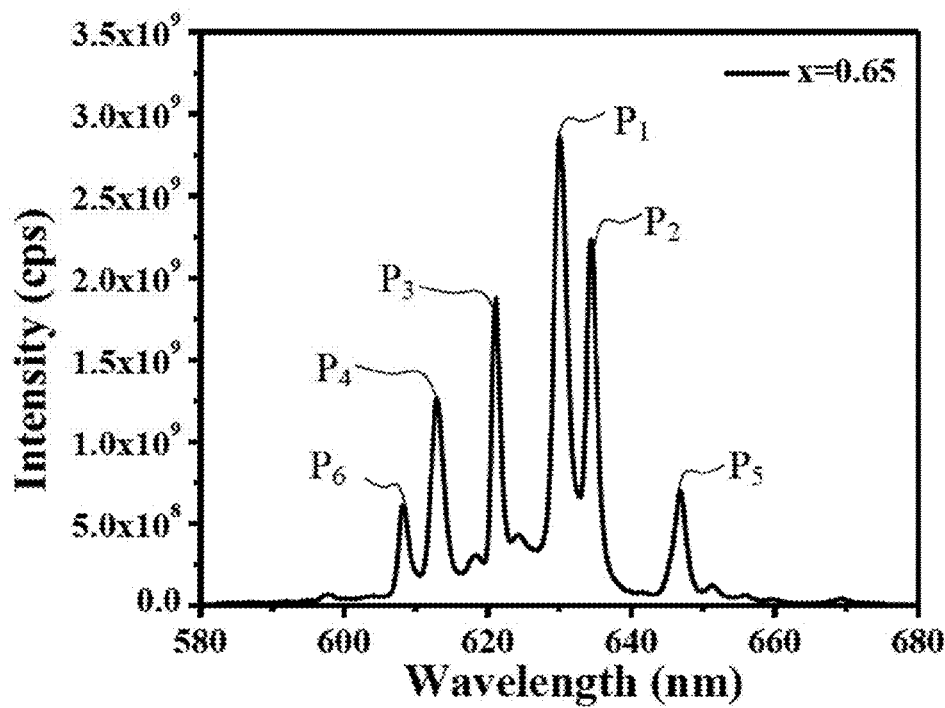

FIG. 5d shows the full width at half maximum (FWHM) of the first main emission peak $P_1$ and the full width at half maximum (FWHM) of the second main emission peak $P_2$ of the fourth embodiment. From FIG. 5d, the FWHM of the first main emission peak $P_1$ of the fourth embodiment is about 2.2±0.1 nm. The FWHM of the second main emission peak $P_2$ of the fourth embodiment is about 1.8±0.1 nm.

TABLE 5 the wavelengths and the intensities of the main emission
peaks of the fifth embodiment
5th embodiment: $K_2[Si_{0.25}Ge_{0.75}]_{0.95}F_6:Mn_{0.05}^{4+}$

| Main emission peak | Wavelength (nm) | Intensity (cps) |
| --- | --- | --- |
| sixth main emission peak ($P_6$) | 608.4 | 5.94E+08 |
| fourth main emission peak ($P_4$) | 613 | 1.27E+09 |
| | 613.2 | 1.27E+09 |
| third main emission peak ($P_3$) | 621.2 | 1.72E+09 |
| first main emission peak ($P_1$) | 630.2 | 3.04E+09 |
| second main emission peak ($P_2$) | 634.6 | 2.32E+09 |
| fifth main emission peak ($P_5$) | 647 | 6.83E+08 |

From Table 5, the ratio of the first maximum emission intensity of the first main emission peak $P_1$ to the second maximum emission intensity of the second main emission peak $P_1$ is about 1.31.

Figure 5E:
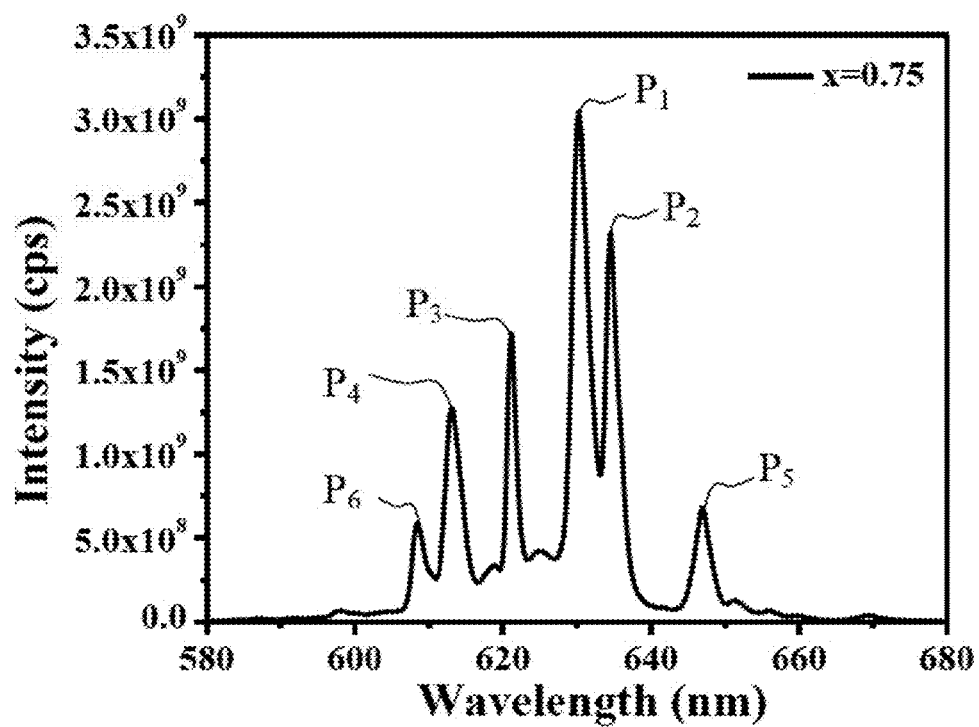

FIG. 5e shows the full width at half maximum (FWHM) of the first main emission peak $P_1$ and the full width at half maximum (FWHM) of the second main emission peak $P_2$ of the fifth embodiment. The FWHM of the first main emission peak of the fifth embodiment is about 3±0.1 nm. The FWHM of the second main emission peak $P_2$ of the fifth embodiment is about 2.4±0.1 nm.

TABLE 6 the wavelengths and the intensities of the main emission peaks of the sixth embodiment
$6^{th}$ embodiment: $K_2[GeF_6]_{0.95}:Mn_{0.05}^{4+}$

| Main emission peak | Wavelength (nm) | Intensity (cps) |
|---|---|---|
| fifth main emission peak ($P_5$) | 609.2 | 4.54E+08 |
| third main emission peak ($P_3$) | 614.2 | 1.07E+09 |
| first main emission peak ($P_1$) | 631.2 | 2.5E+09 |
| second main emission peak ($P_2$) | 635.8 | 1.75E+09 |
| fourth main emission peak ($P_4$) | 648.2 | 4.73E+08 |

From Table 6, the ratio of the first maximum emission intensity of the first main emission peak to the second maximum emission intensity of the second main emission peak is about 1.43.

Figure 5F:
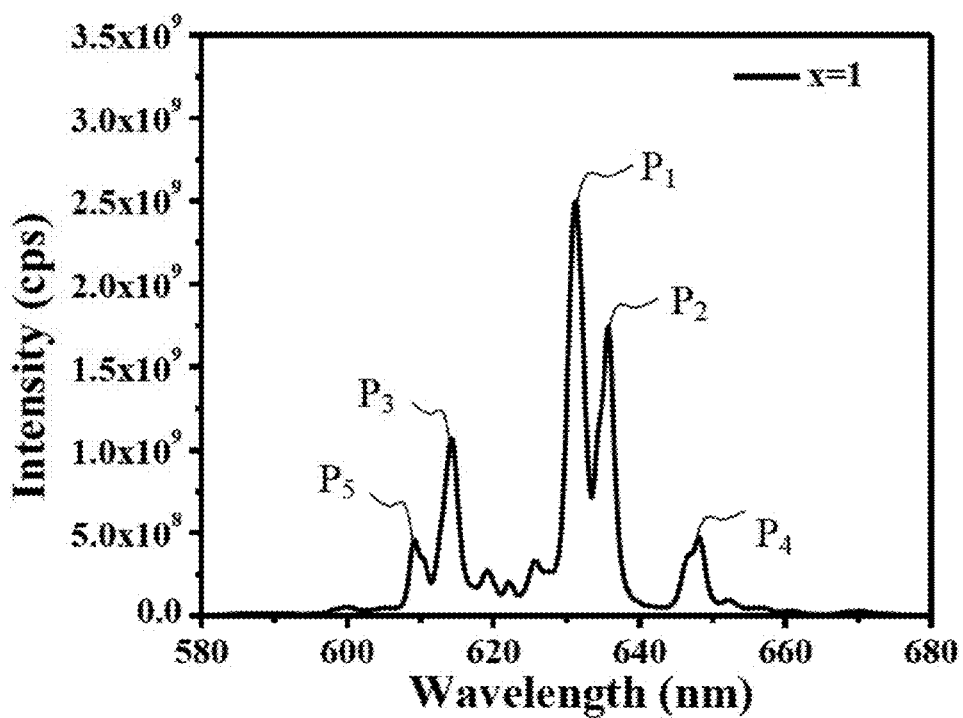

FIG. 5f shows the full width at half maximum (FWHM) of the first main emission peak $P_1$ and the full width at half maximum (FWHM) of the second main emission peak $P_2$ of the sixth embodiment. From FIG. 5f, the FWHM of the first main emission peak $P_1$ of the sixth embodiment is about 2.6±0.1 nm. The FWHM of the second main emission peak $P_2$ of the sixth embodiment is about 2.8±0.1 nm.

Figure 6:
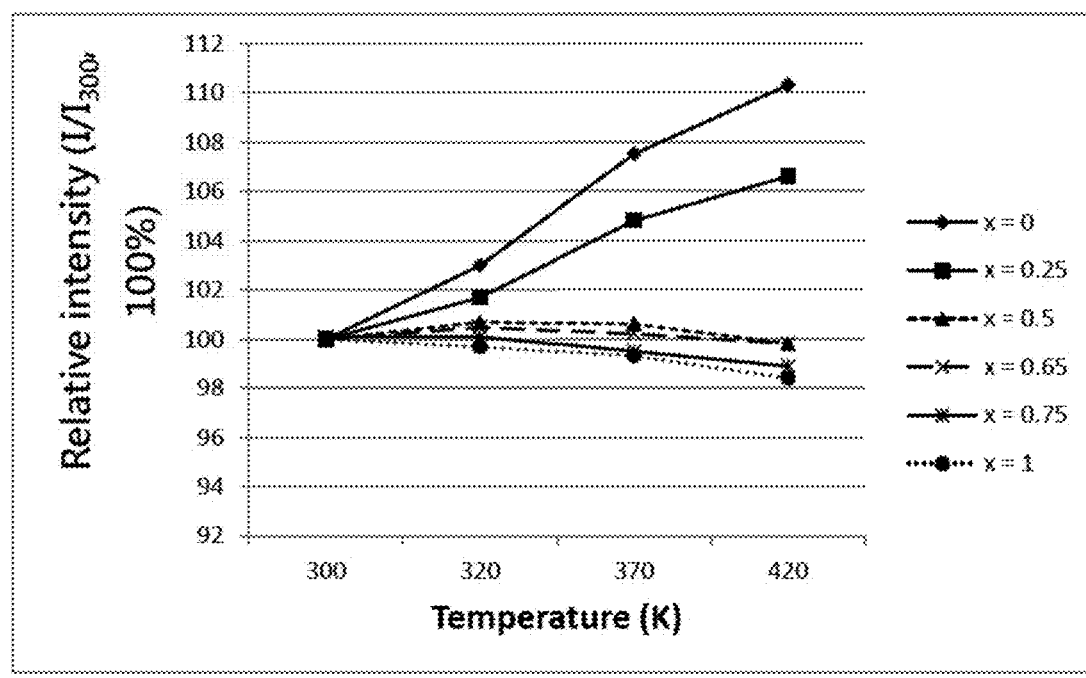
FIG. 6 is a graph showing the relationship between the relative intensity and the temperature of the phosphors of the first through sixth embodiments respectively.

Tables. 7 and 8 show the data of the relative intensities at different temperatures of the phosphors of the first through sixth embodiments. FIG. 6 is a graph showing the relationship between the relative intensity and the temperature of the phosphors of the first through sixth embodiments respectively. From Tables. 7 and 8 and FIG. 6, the relative emission intensities of the phosphors of the first through the sixth embodiment are between 90% and 115% when 300 K<T≤470 K. Specifically, the relative emission intensities of the phosphors of the first through the sixth embodiment are between 95% and 115%, and preferably, between 97% and 115%, when 320 K≤T≤420 K. Specifically, the relative emission intensities of the phosphors of the first through the sixth embodiment are between 95% and 115%, and preferably, between 97% and 115%, when 370 K≤T≤420 K.

TABLE 7

The data of the relative intensities at different temperatures of the phosphors of the first through the third embodiments

| $1^{st}$ embodiment x = 0 y = 0.95 | | $2^{nd}$ embodiment x = 0.25 y = 0.95 | | $3^{rd}$ embodiment x = 0.5 y = 0.95 | |
|---|---|---|---|---|---|
| Temp (K) | Relative Intensity | Temp (K) | Relative Intensity | Temp (K) | Relative Intensity |
| 300 | 100 | 300 | 100 | 300 | 100 |
| 320 | 103 | 320 | 101.7 | 320 | 100.7 |
| 370 | 107.5 | 370 | 104.8 | 370 | 100.6 |
| 420 | 110.3 | 420 | 106.6 | 420 | 99.8 |
| 470 | 110.67 | 470 | 103.9 | 470 | 95.2 |

TABLE 8

The data of the relative intensities at different temperatures of the phosphors of the fourth through the sixth embodiments

| $4^{th}$ embodiment x = 0.65 y = 0.95 | | $5^{th}$ embodiment x = 0.75 y = 0.95 | | $6^{th}$ embodiment x = 1 y = 0.95 | |
|---|---|---|---|---|---|
| Temp (K) | Relative Intensity | Temp (K) | Relative Intensity | Temp (K) | Relative Intensity |
| 300 | 100 | 300 | 100.1 | 300 | 100 |
| 320 | 100.5 | 320 | 100.1 | 320 | 99.7 |
| 370 | 100.2 | 370 | 99.49 | 370 | 99.3 |
| 420 | 99.8 | 420 | 98.88 | 420 | 98.4 |
| 470 | 94.2 | 470 | 91.92 | 470 | 91.2 |

In another embodiment, a light-emitting device comprises the phosphor of the present application as mentioned above. The light-emitting device emits a white radiation. The white radiation has a correlated color temperature between 3000 K and 5000 K both inclusive, and preferably, between 2000 K and 3500K. The white radiation has an Ra between 93 and 95, an R9 value greater than 90, and an efficacy between 110 lm/W and 120 lm/W.

FIG. 7 through FIG. 10 show various forms integrating the phosphor of the present application as mentioned above with a light-emitting die to form a light-emitting device in accordance with the present disclosure.

Figure 7:
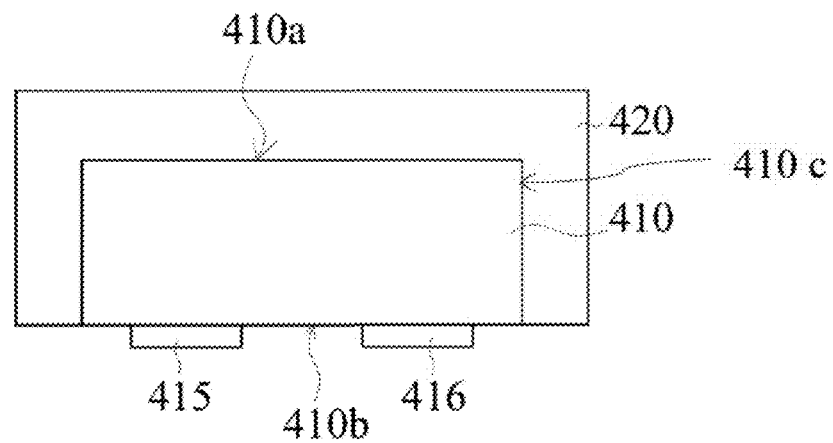
FIGS. 7 through 10 show various light-emitting devices integrating the phosphor of the present application.

FIG. 7 shows a first example of a light-emitting device comprises the phosphor of the present application. The light-emitting device comprises a light-emitting die 410 and a phosphor sheet 420 comprising the phosphor of the present application. The phosphor sheet 420 conformally covers the side faces 410c and the top face 410a of the light-emitting die 410. A first electrode 415 and a second electrode 416 are formed on a bottom face 410 b of the light-emitting die 410

Figure 8:
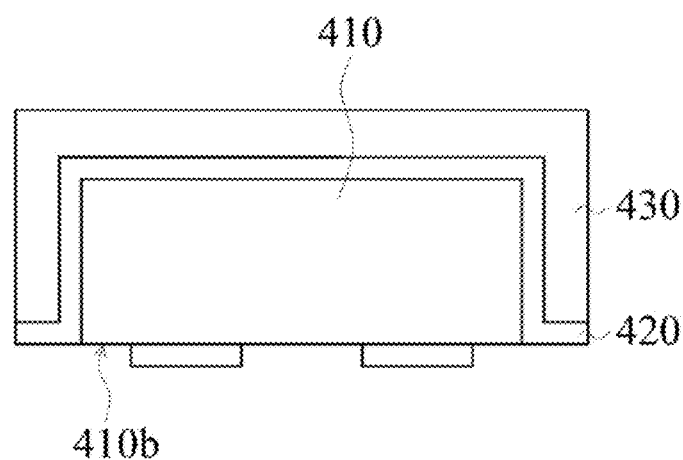

FIG. 8 shows a second example of a light-emitting device comprising the phosphor of the present application. The difference between the present light-emitting device and the light-emitting device as shown in FIG. 7 is that the phosphor sheet 420 extends outwardly and is coplanar with the bottom face 410b of the light-emitting die 410. A cap layer 430 is formed on the phosphor sheet 420. The cap layer 430 is substantially transparent to the light emitted from the light-emitting die 410.

Figure 9:
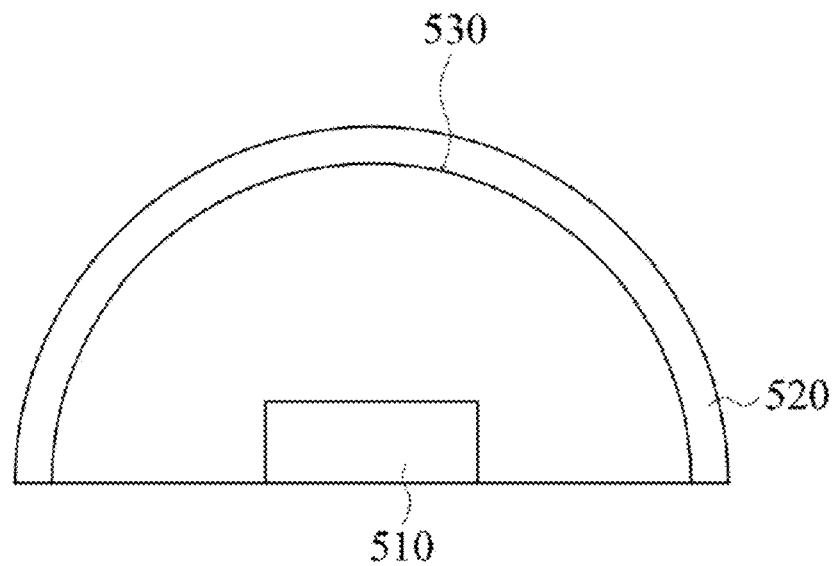

FIG. 9 shows a third example of a light-emitting device comprising the phosphor of the present application. The light-emitting device comprises a light-emitting die 510, a phosphor sheet 520 comprising the phosphor of the present application, and an optical element 530. The optical element 530 encapsulates the light-emitting die 510. The phosphor sheet 520 is conformally formed on the optical element 530 and thus is separated from the light-emitting die 510 by the optical element 530. In one embodiment, the optical element 530 comprises a semi-spherical lens.

Figure 10:
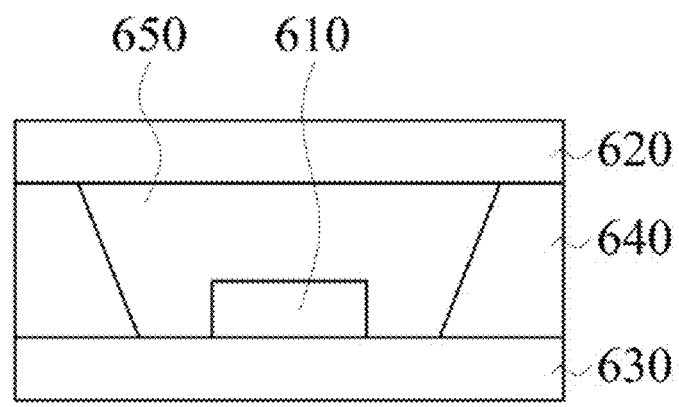

FIG. 10 shows a fourth example of a light-emitting device comprising the phosphor of the present application. The light-emitting device comprises a light-emitting die 610 on a sub-mount 630, a case 640 on the sub-mount 630 and surrounding the light-emitting structure 610 to form a recess, an encapsulation 650 filled in the recess and covering the light-emitting structure 610, and a phosphor sheet 620 formed above the case 640 and the encapsulation 650. The case 640 comprises a reflective coating or is formed of a reflective material.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A phosphor, having a general formula of $K_2[Si_{1-x}Ge_x]_yF_6:Mn_{1-y}^{4+}$, wherein $0.4 \leq x \leq 0.8$ and $0.8 \leq y < 1$, being excited to emit a light having a first main emission peak with a first maximum emission intensity and a first dominant wavelength, comprising multiple discrete particles having a shape of irregular polyhedron, wherein a relative emission intensity S of the light of the phosphor is constantly greater than 85% across an temperature of the phosphor between 300 K and 470 K during operation, wherein $S=(I_T/I_{RT})*100\%$, $I_{RT}$ and $I_T$ are the first maximum emission intensity when the temperature of the phosphor is at 300 K and T during operation respectively, and 300 K<T≤470K.

2. The phosphor according to claim 1, wherein the first dominant wavelength is between 600 nm and 650 nm.

3. The phosphor according to claim 2, wherein the phosphor being excited to emit the light comprising a second main emission peak with a second maximum emission intensity and a second dominant wavelength between 634.2 nm and 635.8 nm and higher than the first dominant wavelength.

4. The phosphor according to claim 3, wherein a ratio of the first maximum emission intensity to the second maximum emission intensity is between 1.1 and 1.7.

5. The phosphor according to claim 3, wherein the second main emission peak has a full width at half maximum (FWHM) of not more than 7 nm.

6. The phosphor as claimed in claim 1, wherein when 320 K≤T≤420 K, the relative emission intensity is between 97% and 105%.

7. The phosphor according to claim 1, wherein when 350 K≤T≤430 K, the relative emission intensity is between 95% and 115%.

8. The phosphor as claimed in claim 1, wherein the first main emission peak has a full width at half maximum of not more than 6 nm.

9. The phosphor as claimed in claim 1, wherein the multiple discrete particles having an average particle diameter between 10 μm and 60 μm.

10. The phosphor as claimed in claim 1, wherein one of the particles with a diameter not less than 10 μm has a number of faces, and the number of faces is not less than 3.

11. The phosphor as claimed in claim 10, wherein the number is not less than 4.

12. A light-emitting device, comprising the phosphor as claimed in claim 1, wherein the light-emitting device emits a white radiation.

13. The light-emitting device as claimed in claim 12, wherein the white radiation has a correlated color temperature between 3000 K and 5000 K both inclusive.

* * * * *